United States Patent [19]

Miyazaki

[11] 4,153,848
[45] May 8, 1979

[54] RECEIVER CIRCUIT

[75] Inventor: Seiichi Miyazaki, Wakou, Japan

[73] Assignee: Ohkura Electric Co. Ltd., Tokyo, Japan

[21] Appl. No.: 813,296

[22] Filed: Jul. 6, 1977

[30] Foreign Application Priority Data

Jul. 7, 1976 [JP] Japan .................... 51-90154[U]

[51] Int. Cl.² .................... H03K 5/01; H03K 5/153
[52] U.S. Cl. .................... 307/268; 307/236; 307/354; 307/362; 328/118; 328/164
[58] Field of Search ............... 307/236, 260, 262, 354, 307/362, 268; 328/57, 62, 118, 164

[56] References Cited

U.S. PATENT DOCUMENTS

| | | | |
|---|---|---|---|
| 3,187,260 | 6/1965 | Dove | 307/262 X |
| 3,843,907 | 10/1974 | Genuit et al. | 307/362 X |
| 4,021,685 | 5/1977 | Goodall et al. | 328/164 X |

Primary Examiner—John Zazworsky
Attorney, Agent, or Firm—Sherman & Shalloway

[57] ABSTRACT

A receiver circuit for receiving a double current pulse signal from a transmission line and delivering positive pulse or a negative pulse corresponding to that of the double current pulse signal in a discriminating manner. The circuit comprises an input transformer having a secondary winding divided into two halves; a resistor connected in series with each output terminal of the input transformer and having a resistance value which is considerably higher than a characteristic impedance of the transmission line; a diode having a cathode connected to an output terminal of the resistor and an anode connected to ground; and an amplifier having input terminals connected to the resistor and the diode, respectively, and delivering either a positive pulse or a negative pulse corresponding to that of the double current pulse signal in a discriminating manner.

3 Claims, 3 Drawing Figures

1

RECEIVER CIRCUIT

BACKGROUND OF THE INVENTION

This invention relates to a receiver circuit for receiving a double current pulse signal from a transmission line and delivering either a positive pulse or a negative pulse corresponding to that of the double current pulse signal in a discriminating manner.

SUMMARY OF THE INVENTION

An object of the invention is to provide a receiver circuit of the kind described above which has an input impedance considerably higher than a characteristic impedance of a transmission line and which can alleviate a load subjected to a double current pulse signal delivered from the transmission line.

A feature of the invention is the provision of a receiver circuit for receiving a double current pulse signal from a transmission line, comprising an input transformer having a secondary winding divided into two halves; a resistor connected in series with each output terminal of the input transformer and having a resistance value which is considerably higher than a characteristic impedance of the transmission line; a diode having a cathode connected to an output terminal of the resistor and an anode connected to ground; and an amplifier having input terminals connected to the resistor and the diode, respectively, and delivering either a positive pulse or a negative pulse corresponding to that of the double current pulse signal in a discriminating manner.

Output terminals of the two amplifiers provided for the two halves of the secondary winding of the transformer may be connected to set and reset input terminals of a SR type flipflop, respectively, for the purpose of providing a receiver circuit having a hysteresis characteristic.

BRIEF DESCRIPTION OF THE DRAWINGS

The invention will now be described in greater detail with reference to the accompanying drawings, wherein.

DESCRIPTION OF THE PREFERRED EMBODIMENTS

Figure 1:
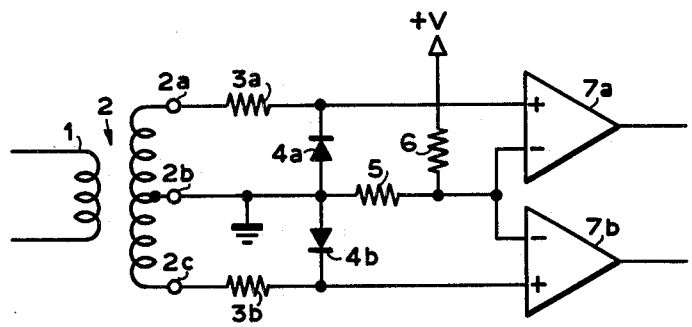
FIG. 1 is a circuit diagram of one embodiment of a receiver circuit according to the invention.
Figure 2:
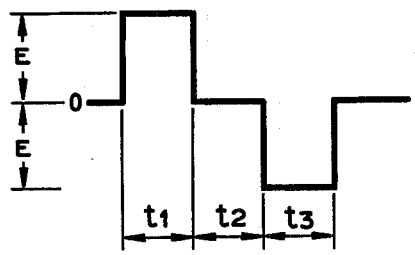
FIG. 2 is a wave form diagram illustrating the function of the receiver circuit shown in FIG. 1.

In FIG. 1 is shown one embodiment of a receiver circuit according to the invention. In the present embodiment a double current pulse signal shown in FIG. 2 is supplied from a transmission line 1 to a transformer 2 having a secondary winding divided into two halves whose center terminal 2b is connected to ground.

At a time $t_1$, a positive pulse is supplied from a terminal 2a through a resistor 3a to an amplifier 7a. To an output terminal of the resistor 3a is connected a cathode of a diode 4a whose anode is connected to ground. At the time $t_1$, the positive pulse is applied from the terminal 2a to the diode 4a which then functions as a high impedance. As a result, a positive pulse voltage induced across the terminals 2a and 2b is divided by the resistors 3a and 5 and the remainder voltage is applied to the amplifier 7a. The input impedance of the amplifier 7a, however, is considerably higher than the resistance values of the resistors 3a and 5, so that the voltage component divided by the resistors 3a and 5 is negligibly small.

As a result, substantially all of the positive pulse voltage induced across the terminals 2a and 2b is applied to the amplifier 7a. A negative pulse signal voltage induced across the terminals 2b and 2c is applied to that portion of the receiver circuit which is symmetrical to the above described circuit portion. To the output terminal of a resistor 3b is connected a cathode of a diode 4b, so that a forward voltage is applied to the diode 4b which hence functions as a low impedance. As a result, the output terminal voltage of the diode 4b becomes substantially ground voltage. The resistor 5 and the diode 4b function to produce a very low voltage which is then applied to an input amplifier 7b. Hence, the output voltage of the input amplifier 7b becomes substantially zero. In this case, a pulse signal delivered from the amplifier 7a corresponds to the positive pulse of the double current pulse signal supplied from the transmission line 1.

At a time $t_2$, a pulse signal voltage supplied to the transformer is zero, so that the output voltages delivered from the terminals 2a, 2b and 2b, 2c are also zero. As a result, both the diodes 4a and 4b function as a high impedance, respectively. The output voltages delivered from the amplifiers 7a and 7b become zero, respectively.

At a time $t_3$, a negative pulse is supplied from the terminal 2c through a resistor 3b to the amplifier 7b. In the substantially the same manner as in the case of the positive pulse, the output voltage of the input amplifier 7a becomes zero, while a negative pulse is delivered from the input amplifier 7b. This negative pulse corresponds to the negative pulse of the double current pulse signal supplied from the transmission line 1.

As stated hereinbefore, in the present invention, to respective output terminals of two halves of the secondary winding are connected in series resistors and between the output terminals of these resistors and the ground are connected diodes, respectively, for the purpose of making the input impedance of the receiver circuit considerably higher than the characteristic impedance of the transmission line and the forward input voltages produced across these diodes are applied to the respective input amplifiers. The receiver circuit connected and arranged as above described according to the invention has the following advantages.

(A) The resistors 3a and 3b function as a resistor of a CR filter, so that it is possible to make the input impedance of the receiver circuit considerably higher than the characteristic impedance of the transmission line without requiring any CR filter.

Figure 3:
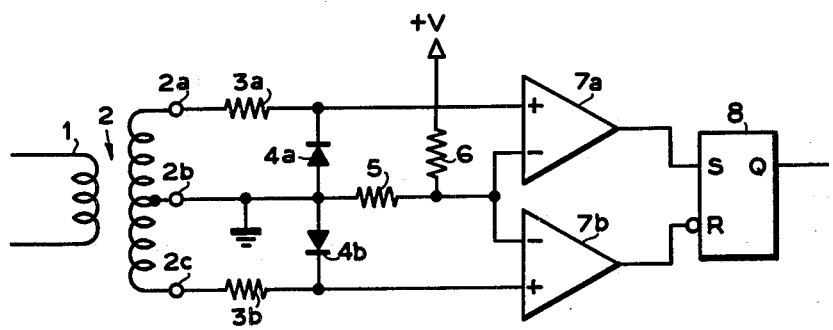
FIG. 3 is a circuit diagram of another embodiment of a receiver circuit according to the invention having a hysteresis characteristic.

(B) Respective output terminals of the amplifiers 7a and 7b may be connected to set and reset terminals S and R of a SR type flipflop 8, respectively, as shown in FIG. 3 so as to provide a receiver circuit having a hysteresis characteristic in an easy manner.

(C) It is possible to deliver positive and negative pulses of a double current pulse signal in a discriminating manner.

(D) The diodes 4a and 4b can prevent the amplifiers 7a and 7b from being supplied with a high reverse voltage. There is no risk of the input impedance of the receiver circuit being decreased by the presence of these diodes.

The invention is not limited to the embodiments described above, but many modification and alteration may be made without departing from the spirit of the invention.

What is claimed is:

1. A receiver circuit for receiving a double current pulse signal from a transmission line having a characteristic impedance and delivering in a discriminating manner, positive and negative pulses corresponding to that of the double current pulse signal, said receiver circuit comprising:
   (a) an input transformer having a primary winding connected to the transmission line and a secondary winding divided into a first half having a first output, a second half having a second output, and a grounded center terminal;
   (b) a first resistor connected in series with the first output having a higher resistance value than the characteristic impedance of the transmission line;
   (c) a second resistor connected in series with the second output having a higher resistance value than the characteristic impedance of the transmission line;
   (d) a first diode having a cathode connected to the first resistor and an anode connected to the grounded center terminal;
   (e) a second diode having a cathode connected to the second resistor and an anode connected to the grounded center terminal;
   (f) a first amplifier having a first input connected to the first resistor and the cathode of the first diode and a second input connected to the grounded center terminal, the first amplifier having an input impedance;
   (g) a second amplifier having a first input connected to the second resistor and the cathode of the second diode and a second input connected to the grounded center terminal, the second amplifier having an input impedance;
   (h) the first and second diodes preventing the first and second amplifiers, respectively, from being supplied with a high reverse voltage;
   (i) the first and second resistors having values such that an input impedance of said receiver circuit is higher than the characteristic impedance of the transmission line; and
   (j) a third resistor having a resistance value and connected in series between the grounded center terminal and second inputs of the first and second amplifiers, respectively, the input impedance of the first amplifier being higher than the resistance value of each of the first and third resistors and the input impedance of the second amplifier being higher than the resistance value of each of the second and third resistors.

2. The receiver circuit of claim 1 wherein the first and second amplifiers each have outputs and means for providing a hysteresis characteristic is connected to the amplifier outputs.

3. The receiver circuit of claim 2 wherein said means is an SR type flipflop having a set terminal connected to the first amplifier output and a reset terminal connected to the second amplifier output.

* * * * *